US012598841B2

(12) United States Patent
Lee et al.

(10) Patent No.: US 12,598,841 B2
(45) Date of Patent: Apr. 7, 2026

(54) LIGHTING MODULE AND LIGHTING DEVICE HAVING SAME

(71) Applicant: LG INNOTEK CO., LTD., Seoul (KR)

(72) Inventors: Yu Won Lee, Seoul (KR); Jae Hyuk Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 781 days.

(21) Appl. No.: 17/911,482

(22) PCT Filed: Mar. 15, 2021

(86) PCT No.: PCT/KR2021/003183
§ 371 (c)(1),
(2) Date: Sep. 14, 2022

(87) PCT Pub. No.: WO2021/187841
PCT Pub. Date: Sep. 23, 2021

(65) Prior Publication Data
US 2023/0086391 A1    Mar. 23, 2023

(30) Foreign Application Priority Data

Mar. 17, 2020    (KR) ........................ 10-2020-0032491

(51) Int. Cl.
*H10H 20/82*    (2025.01)
*H10H 20/851*    (2025.01)
*H10H 20/854*    (2025.01)

(52) U.S. Cl.
CPC ........ *H10H 20/82* (2025.01); *H10H 20/8513* (2025.01); *H10H 20/854* (2025.01)

(58) Field of Classification Search
CPC ... H10H 20/82; H10H 20/854; H10H 20/8213
See application file for complete search history.

(56) References Cited

U.S. PATENT DOCUMENTS 6,580,097 B1 *    6/2003    Soules ............... C09K 11/7731
                                                            313/503
7,633,093 B2 *    12/2009    Blonder .............. H01L 25/0753
                                                            257/E33.001

(Continued)

FOREIGN PATENT DOCUMENTS

CN        102064246        5/2011
CN        110047989        7/2019

(Continued)

OTHER PUBLICATIONS

European Search Report dated Mar. 25, 2024 issued in Application No. 21770810.6.

(Continued)

*Primary Examiner* — Mark W Tornow
(74) *Attorney, Agent, or Firm* — KED & ASSOCIATES, LLP

(57)    ABSTRACT

The lighting device disclosed in the embodiment of the invention includes: a substrate including a recess; a light source on the substrate; a resin layer on the substrate; and a wavelength conversion layer on the resin layer. A portion of the resin layer is disposed in a recess of the substrate. A portion of the wavelength conversion layer is disposed on the recess of the substrate. The outermost surface of the portion of the resin layer disposed in the recess of the substrate may be located outside the inner surface of the wavelength conversion layer.

20 Claims, 9 Drawing Sheets

(56) References Cited

U.S. PATENT DOCUMENTS

| | | | |
|---|---|---|---|
| 8,541,798 B2 | 9/2013 | Ooya et al. | |
| 8,558,446 B2 * | 10/2013 | Miki | H01L 25/0753 |
| | | | 313/512 |
| 8,746,932 B2 | 6/2014 | Ide et al. | |
| 9,111,464 B2 * | 8/2015 | Bibl | H01L 25/167 |
| 9,512,970 B2 * | 12/2016 | Edwards | F21V 9/45 |
| 10,937,770 B2 | 3/2021 | Harada et al. | |
| 2008/0029774 A1 | 2/2008 | Shishov et al. | |
| 2008/0032142 A1 * | 2/2008 | Tasumi | H10H 20/8515 |
| | | | 257/E33.059 |
| 2008/0093606 A1 * | 4/2008 | Pan | H01L 24/97 |
| | | | 257/E33.001 |
| 2009/0015137 A1 * | 1/2009 | Su | H10H 20/8513 |
| | | | 313/503 |
| 2010/0230693 A1 * | 9/2010 | Tran | H10H 20/8506 |
| | | | 257/E33.059 |
| 2011/0116271 A1 | 5/2011 | Ide et al. | |
| 2012/0132944 A1 * | 5/2012 | Hsieh | H10H 20/841 |
| | | | 257/E33.061 |
| 2013/0069098 A1 * | 3/2013 | Hikosaka | H10H 20/8513 |
| | | | 257/98 |

| | | | |
|---|---|---|---|
| 2014/0367633 A1 | 12/2014 | Bibl et al. | |
| 2015/0236203 A1 | 8/2015 | Oh et al. | |
| 2017/0288100 A1 | 10/2017 | Hung et al. | |
| 2019/0221550 A1 | 7/2019 | Harada et al. | |

FOREIGN PATENT DOCUMENTS

| | | |
|---|---|---|
| JP | 2012138561 | 7/2012 |
| JP | 2015-159325 | 9/2015 |
| KR | 10-2010-0079272 | 7/2010 |
| KR | 10-2014-0067595 | 6/2014 |
| KR | 10-2020-0025445 | 3/2020 |

OTHER PUBLICATIONS

International Search Report dated Jul. 5, 2021 issued in Application No. PCT/KR2021/003183.

Korean Office Action dated Jun. 2, 2025, issued in Application No. 10-2020-0032491.

Chinese Office Action dated Aug. 28, 2025, issued in Application No. 202180022079.6.

* cited by examiner

LIGHTING MODULE AND LIGHTING DEVICE HAVING SAME

CROSS-REFERENCE TO RELATED PATENT APPLICATIONS

This application is a U.S. National Stage Application under 35 U.S.C. § 371 of PCT Application No. PCT/KR2021/003183, filed Mar. 15, 2021, which claims priority to Korean Patent Application No. 10-2020-0032491, filed Mar. 17, 2020, whose entire disclosures are hereby incorporated by reference.

TECHNICAL FIELD

An embodiment of the invention relates to a lighting module and a lighting device having a light source and a resin layer. An embodiment of the invention relates to a lighting module and a lighting device for providing surface light through a resin having a colored surface. An embodiment of the invention relates to a vehicle lamp having a lighting module or lighting device.

BACKGROUND ART

Lighting applications include vehicle lights as well as backlights for displays and signage. A light emitting device, for example, a light emitting diode (LED), has advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since a directivity angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

Embodiments of the invention may provide a lighting module and a lighting device that provide surface light through a colored surface. An embodiment of the invention may provide a lighting module and a lighting device having a resin layer covering a light source and a wavelength conversion layer covering the resin layer. An embodiment of the invention may provide a lighting module and a lighting device in which a recess is disposed in a substrate in which a light source is disposed, and at least one or both of a part of a resin layer and a part of a wavelength conversion layer are disposed in the recess. An embodiment of the invention may provide a lighting module and a lighting device in which a recess is disposed in a substrate on which a light source is disposed, and at least one or two or more of a portion of a resin layer, a portion of a phosphor layer, and a portion of an ink layer are disposed in the recess. An embodiment of the invention may provide a lighting module and a lighting device in which a recess is disposed in a substrate on which a light source is disposed, and the recess is vertically overlapped with a wavelength conversion layer having at least one of a phosphor layer and an ink layer. An embodiment of the invention may provide a lighting module and lighting device in which a recess is disposed in a substrate on which a light source is disposed, and the outermost surface of a portion of the resin layer disposed in the recess is disposed outside the innermost surface or the outermost surface of the wavelength conversion layer. An embodiment of the invention may provide a lighting module and a lighting device in which the recess of the substrate is a hole or groove penetrating from the upper surface to the lower surface of the substrate, and the recess is filled with materials of different resin layers stacked on the substrate. An embodiment of the invention may provide a lighting module irradiating surface light and a lighting device having the same, and may be applied to a light unit, a liquid crystal display device, or a vehicle lamp.

Technical Solution

A lighting device according to an embodiment of the invention includes: a substrate including a recess; a light source disposed on the substrate; a resin layer disposed on the substrate; and a wavelength conversion layer disposed on the resin layer, wherein a portion of the resin layer is disposed in a recess of the substrate, and a portion of the wavelength conversion layer is disposed on the recess of the substrate, wherein the outermost surface of the portion of the resin layer disposed in the recess of the substrate may be located outside an inner surface of the wavelength conversion layer.

According to an embodiment of the invention, the recess of the substrate may overlap side surfaces of the wavelength conversion layer and the resin layer in a vertical direction. A lighting device according to an embodiment of the invention includes: a substrate including a recess; a light source disposed on the substrate; a resin layer disposed on the substrate; and a wavelength conversion layer disposed on the resin layer, wherein the light source includes a plurality of light emitting devices disposed in N rows and M columns, the wavelength conversion layer including an upper portion disposed on the upper surface of the resin layer, and a side portion connected to the upper portion and disposed on a side surface of the resin layer, and the recess of the substrate may vertically overlap a portion of the side portion of the wavelength conversion layer. According to an embodiment of the invention, a portion of the recess of the substrate may be located outside the outer surface of the resin layer. Another part of the recess of the substrate may be located inside the outer surface of the resin layer.

According to an embodiment of the invention, a width of the recess of the substrate may be greater than a thickness of the wavelength conversion layer. A depth of the recess of the substrate may be less than or equal to a thickness of the substrate. A lower end of the wavelength conversion layer overlapping the recess of the substrate may be disposed in the recess of the substrate or may be disposed on the same plane as the upper surface of the substrate. According to an embodiment of the invention, the maximum height of one region of the wavelength conversion layer overlapping the recess of the substrate may be greater than or equal to a height of the wavelength conversion layer disposed on the substrate. According to an embodiment of the invention, the recess may be a groove or a hole. The light emitting device may include an LED chip and a resin member disposed on the LED chip. According to an embodiment of the invention, the wavelength conversion layer may include a phosphor layer and an ink layer disposed on the phosphor layer. The wavelength conversion layer may be formed by mixing a colored phosphor and a colored ink. According to an embodiment of the invention, a pitch between two adjacent light emitting devices among the plurality of light emitting devices may be 5 mm or more.

A lighting device according to an embodiment of the invention includes: a substrate; a light source disposed on the substrate; a resin layer disposed on the substrate; and a wavelength conversion layer disposed on the resin layer, wherein the wavelength conversion layer includes a first side surface corresponding to a first side surface of the resin layer, and the first side surface of the wavelength conversion layer may include a first region overlapping a portion of the resin layer and the substrate in a vertical direction. According to an embodiment of the invention, the first region of the wavelength conversion layer may be spaced apart from the substrate.

A portion of the resin layer may be disposed between the first region and the substrate. The wavelength conversion layer may include a hole, and the first region may be a region on the hole.

Advantageous Effects

According to an embodiment of the invention, it is possible to improve the uniformity of the surface light by the lighting module or device. According to an embodiment of the invention, light from a light source may be diffused in a lighting module or device, and the diffused light may be wavelength-converted and emitted through a colored surface. According to an embodiment of the invention, since a colored wavelength conversion layer is provided in a lighting module or device, it is possible to suppress hot spot, and provide a colored image on the surface when the light is turned off. According to an embodiment of the invention, a flexible lighting module may be provided by laminating a plurality of layers of a resin material to a thin thickness on a substrate. According to an embodiment of the invention, it is possible to block the leakage of light through the side portion of the layer laminated with the resin material on the substrate. Accordingly, it is possible to improve the optical reliability of the lighting module or device. Embodiments of the invention may improve light efficiency and light distribution characteristics of surface lighting, and may reduce a difference in chromaticity between an exterior image and a light emitting image. It may be applied to a vehicle lamp, a backlight unit, various types of display devices, a surface light source lighting device, or a vehicle lamp having a lighting device according to an embodiment of the invention.

BEST MODE

Figure 1:
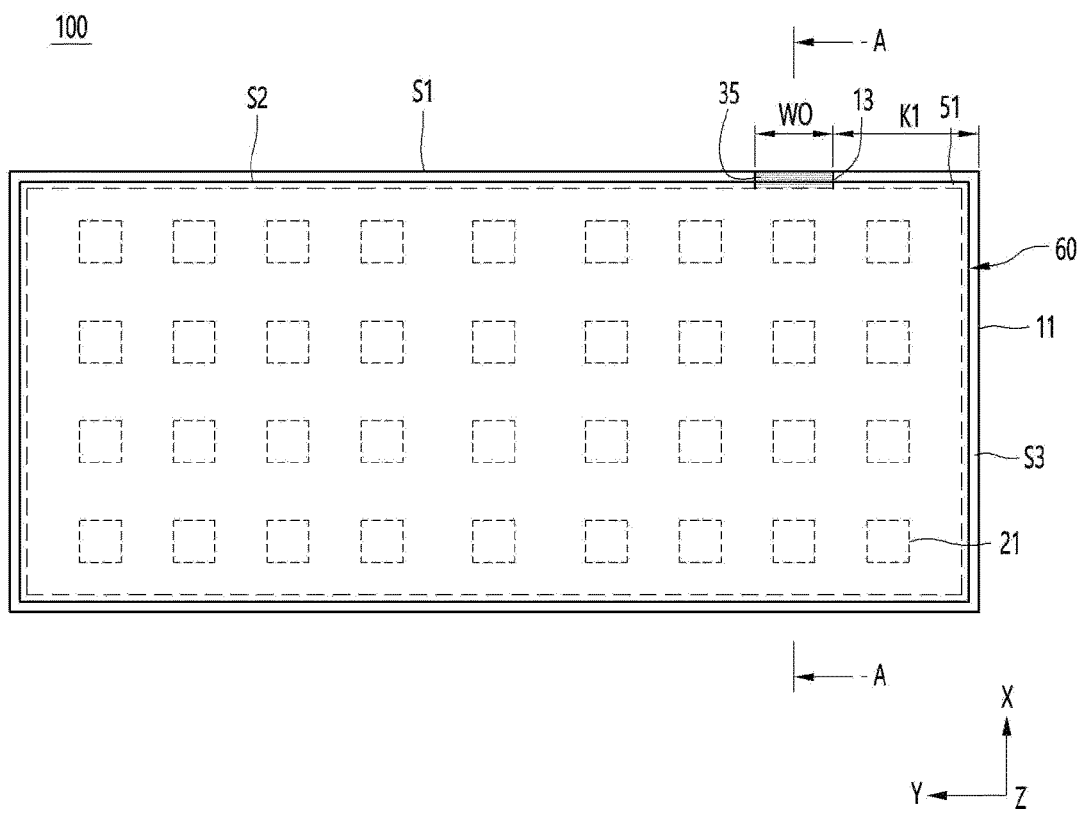
FIG. 1 is an example of a plan view showing a lighting device according to an embodiment of the invention.

Hereinafter, preferred embodiments of the invention will be described in detail with reference to the accompanying drawings. The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to various lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

First Embodiment

Figure 2:
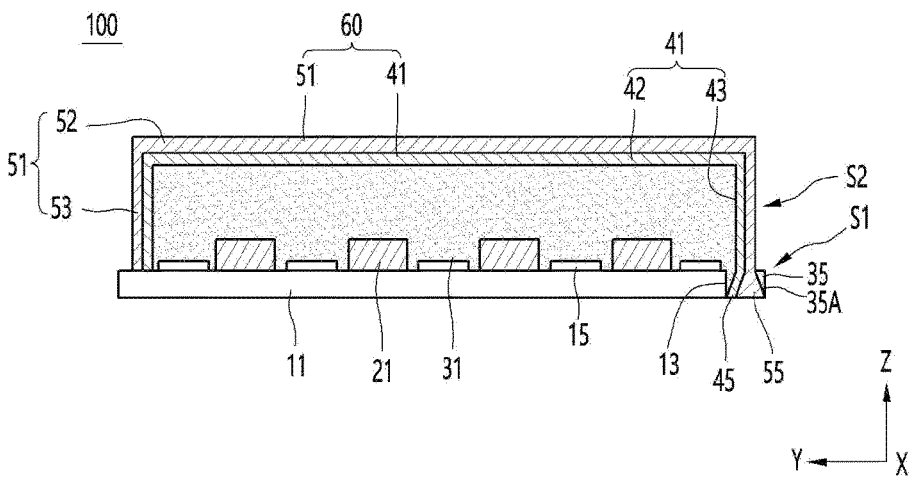
FIG. 2 is a cross-sectional view taken along line A-A of the lighting device of FIG. 1.
Figure 3:
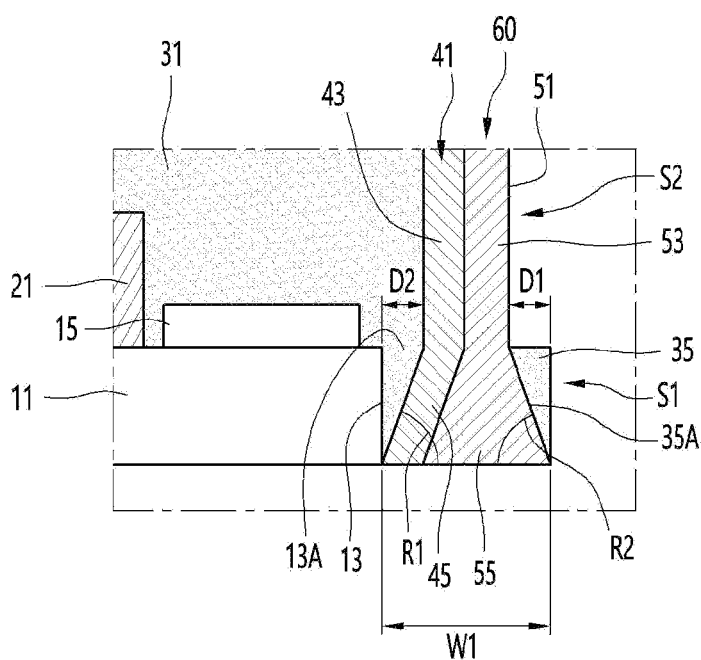
FIG. 3 is a partially enlarged view of a recess in the substrate of FIG. 2.

FIG. 1 is an example of a plan view of a lighting device according to an embodiment of the invention, FIG. 2 is an example of a cross-sectional view taken along line A-A of the lighting device of FIG. 2, and FIG. 3 is a partially enlarged view of a recess in the substrate of FIG. 2. Referring to FIGS. 1 to 3, the lighting device 100 may include a substrate 11, a light source 21 disposed on the substrate 11, a resin layer 31 disposed on the substrate 11, and a wavelength conversion layer 60 on the resin layer 31. The lighting device 100 may emit the light emitted from the light source 21 as surface light. The lighting device 100 may emit the light emitted from the light source 21 as surface light through the colored resin.

The substrate 11 is disposed under the light source 21 and the resin layer 31 and may function as a base member or a support member. The substrate 11 includes a printed circuit board (PCB). The substrate 11 may include, for example, at least one of a resin-based PCB, a metal core PCB, a flexible PCB, a ceramic PCB, and an FR-4 PCB. The substrate 11 may include, for example, a flexible PCB or a rigid PCB. The substrate 11 may include a wiring layer (not shown) thereon, and the wiring layer may be electrically connected to the light source 21. The substrate 11 may include a protective layer (not shown) for protecting the wiring layer. The protective layer may be a material that protects the wiring layer and reflects incident light. The protective layer may include a solder resist material. The top view shape of the substrate 11 may be a rectangle, a square, or other polygonal shapes, and may be a bar shape having a curved shape. A connector (not shown) for supplying power may be disposed in a portion of the substrate 11. As another example, the substrate 11 may include a transparent material. Since the substrate 11 made of the transparent material is provided, the light emitted from the light source 21 may be emitted toward the upper surface, the side surface, and the lower surface of the substrate 11. The upper surface of the substrate 11 may have an X-axis and Y-axis plane, and the thickness of the substrate 11 may be a height in the Z direction orthogonal to the X direction and the Y direction. Here, the X direction may be a first direction, the Y direction may be a second direction orthogonal to the X direction, and the Z direction may be a third direction orthogonal to the X direction and the Y direction. The length of the substrate 11 in the first direction X and the length in the second direction Y may be the same as or different from each other, for example, the length of the first direction X may be smaller than the length of the second direction Y. The length of the second direction Y may be more than twice the length of the first direction X. The thickness of the substrate 11 may be 0.5 mm or less, for example, in the range of 0.3 mm to 0.5 mm. Since the thickness of the substrate 11 is provided to be thin, the thickness of the lighting device may not be increased. Since the substrate 11 has a thickness of 0.5 mm or less, it may support a flexible module.

The thickness of the lighting device 100 may be a distance from the lower surface of the substrate 11 to the upper surface of the wavelength conversion layer 60. The thickness of the lighting device 100 may be ⅓ or less of a short side length among lengths of the substrate 11 in the first and second directions, but is not limited thereto. The thickness of the lighting device 100 may be 5.5 mm or less, or a range of 4.5 mm to 5.5 mm, or a range of 4.5 mm to 5 mm. The thickness of the lighting device 100 may be 220% or less of the thickness of the resin layer 31, for example, in a range of 180% to 220%. Since the lighting device 100 has a thickness of 5.5 mm or less, it may be provided as a flexible and slim surface light module. When the thickness of the lighting device 100 is thinner than the above range, the light diffusion space may be reduced and thus a hot spot may be generated. The lighting device 100 may be provided as a module capable of a curved structure due to its thin thickness. Accordingly, it is possible to reduce the degree of freedom in design and spatial restrictions of the lighting device.

The lighting device 100 may include a reflective member 15 disposed on the substrate 11. The reflective member 15 may reflect the light traveling toward the upper surface of the substrate 11 to the resin layer 31. The reflective member 15 may be attached to all or a part of the upper surface of the substrate 11, for example, may be attached between the substrate 11 and the resin layer 31. The reflective member 15 may have an opening portion in which a region in which the light source 21 is disposed is opened, respectively. The reflective member 15 may be spaced apart from or in contact with the lower side of the wavelength conversion layer 60. The reflective member 15 may have a single-layer or multilayer structure. The reflective member 15 may include a material that reflects light, for example, a metal or a non-metal material. When the reflective member 15 is a metal, it may include a metal layer such as stainless steel, aluminum (Al), or silver (Ag), and in the case of a non-metallic material, it is a white resin material, a material filled with metal oxide and/or air in the resin, or may include a plastic material. For example, the reflective member 15 may include a white resin material or a polyester (PET) material. The reflective member 15 may include at least one of a low reflection film, a high reflection film, a diffuse reflection film, and a regular reflection film.

The light source 21 may include a plurality of light emitting devices disposed on the substrate 11. The plurality of light emitting devices may be arranged in N row×M column, wherein N and M are integers equal to or greater than 1, and may have a relationship of N≥M. For example, N may be 5 rows or more, and M may be 2 columns or more. The plurality of light emitting devices may be connected in series, parallel, or series-parallel by a wiring layer of the substrate 11. In the plurality of light emitting devices, groups having two or more may be connected in series or in parallel, or between the groups may be connected in series or in parallel. The light emitted from the light source 21 may be emitted through the resin layer 31. The light source 21 or the light emitting device may include an LED chip. The light emitting device may include at least one of a blue, green, or red LED chip. The light emitting device may be disposed as an LED chip, or a resin member having a phosphor added thereto and/or an insulating member without a phosphor may be provided on the surface of the LED chip. For example, the light emitting device may emit blue, red, or white light. As another example, the light emitting device may be provided as an ultraviolet (UV) or infrared LED. The light emitting device may emit light through four sides and an upper surface. The light emitting device may be disposed on the substrate 11 as a flip-type LED chip, or may be disposed as a horizontal or vertical LED chip that may be electrically connected by a wire. Since the light source 21 is provided as a flip chip emitting light from at least five sides, the luminance distribution and the beam angle distribution of the light emitted to the light source 21 may be improved. The light source 21 may be provided with a thickness of 0.4 mm or less, for example, in the range of 0.2 mm to 0.4 mm. The light source 21 may include micro-sized LED chips. The micro size may have a side length of 5 μm to 100 μm. A pitch between the light emitting devices of the light source 21 may be equal to or greater than the thickness of the resin layer 31. The pitch may be, for example, 2.5 mm or more, for example, in the range of 2.5 mm to 8 mm or in the range of 5 mm to 7 mm. The pitch between the light emitting devices may vary depending on the size of the LED chip. The light source 21 is disposed on the substrate 11, and may be sealed by the resin layer 31. The light source 21 may be in contact with the resin layer 31. The resin layer 31 may be disposed on a side surface and an upper surface of the light source 21. The resin layer 31 protects the light source 21 and may be in contact with the upper surface of the substrate 11 and/or the reflective member 15. The resin layer 31 may be disposed in a region between the light emitting devices and on each of the light emitting devices, and may guide and diffuse incident light.

The resin layer 31 may be disposed on the substrate 11. The resin layer 31 may contact at least one of the upper surface of the substrate 11, the surface of the reflective member 15, and the surface of the light source 21 and may seal the light source 21. The resin layer 31 may be formed as a single layer or multiple layers. In the case of a single layer, it may be formed as a layer of a transparent resin material, and in the case of a multi-layer, it may include a first layer of a transparent resin material and a second layer having at least one of a diffusion layer, a phosphor layer, or an ink layer on the first layer. As another example, impurities such as a diffusing agent and/or a phosphor may be included in a single resin layer. For example, in an embodiment of the invention, the resin layer 31 may be a layer without impurities or a layer in which a small amount of a diffusing agent is added, for example, 3 wt % or less for light transmission efficiency. The dispersing agent may include at least one of a poly methyl meth acrylate (PMMA) series, $TiO_2$, $SiO_2$, $Al_2O_3$, and silicon series. The phosphor may include at least one of a red phosphor, a green phosphor, a blue phosphor, and a yellow phosphor. The resin layer 31 may include a resin or a resin-based material. The resin layer 31 may be made of a transparent resin material, for example, a resin material such as UV (ultra violet) resin, silicone, or epoxy. The resin layer 31 may have a thickness greater than that of the light source 21. A thickness of the resin layer 31 may be greater than a thickness of the substrate 11. The thickness of the resin layer 31 may be 5 times or more, for example, in a range of 5 to 9 times the thickness of the substrate 11. By disposing the resin layer 31 to the above thickness, the light source 21 may be sealed on the substrate 11, moisture penetration may be prevented, and may support the substrate 11. The resin layer 31 and the substrate 11 may be formed of a flexible plate. The thickness of the resin layer 31 may be 4 mm or less, for example, in the range of 2 mm to 4 mm. When the thickness of the resin layer 31 is less than the above range, hot spots may increase, and when the thickness of the resin layer 31 is smaller than the above range, luminous intensity may decrease or ductility characteristics may be limited. The resin layer 31 is disposed between the substrate 11 and the wavelength conversion layer 60, guides and diffuses the light emitted from the light source 21, and provides it as the wavelength conversion layer 60. When there are no impurities in the resin layer 31, the straightness of light may be improved. When the material of the resin layer 31 has a refractive index of 1.4 or more at the emission wavelength, light uniformity may be improved. Accordingly, the refractive index of the resin material may be 1.8 or less, for example, in the range of 1.1 to 1.8 or 1.4 to 1.6.

The resin layer 31 may have a polygonal top view shape or a curved shape. The lower surface area of the resin layer 31 may be provided as an area smaller than the upper surface area of the substrate 11, for example, 60% or more of the upper surface area of the substrate 11. Side surfaces of the resin layer 31 may be spaced apart from the outer side surface of the substrate 11.

The wavelength conversion layer 60 may be disposed on the resin layer 31. The wavelength conversion layer 60 may be disposed on the upper surface of the resin layer 31, or may be disposed on the upper surface and side surfaces of the resin layer 31. For example, the wavelength conversion layer 60 may include an upper portion disposed on the upper surface of the resin layer 31 and a side portion extending from the upper edge toward the substrate 11. Side portions of the wavelength conversion layer 60 may cover side surfaces of the resin layer 31. Upper and side portions of the wavelength conversion layer 60 may be in contact with the surface of the resin layer 31. The wavelength conversion layer 60 may include a single layer or multiple layers. When the wavelength conversion layer 60 is a single layer, it may be formed of a resin material layer having different impurities. When the wavelength conversion layer 60 is multi-layered, it may be at least two or three layers, and may be formed of layers of a resin material having different impurities, and each of the layers of the resin material may include at least one type of impurities.

As shown in FIGS. 1 and 2, the wavelength conversion layer 60 may include a phosphor layer 41 and an ink layer 51. The phosphor layer 41 may be disposed between the resin layer 31 and the ink layer 51. The phosphor layer 41 may be formed on the surface of the resin layer 31. The phosphor layer 41 may extend from the upper surface of the resin layer 31 to the lower end of the side surface. The outer lower end of the phosphor layer 41 may be in contact with the upper surface of the substrate 11 and/or the upper surface of the reflective member 15. The ink layer 51 may be formed on the outer surface of the phosphor layer 41 and may be in contact with the upper portion 42 and the side portion 43 of the phosphor layer 41. Here, the upper portion 42 of the phosphor layer 41 and the upper portion 52 of the ink layer 51 are the upper portion of the wavelength conversion layer 60, and the side portion 43 of the phosphor layer 41 and the side portion 53 of the ink layer 51 may be a side portion of the wavelength conversion layer 60. The ink layer 51 may be the outermost layer of the wavelength conversion layer 60 and may provide a surface color of the lighting device. The color of the phosphor added to the phosphor layer 41 may not be exposed to the surface of the ink layer 51. The phosphor layer 41 may be made of a transparent resin material, for example, a silicone or epoxy material, or UV (ultra violet) resin. The phosphor layer 41 may include a colored phosphor in a transparent material, for example, may include at least one of a red phosphor, a blue phosphor, a yellow phosphor, a green phosphor, and a white phosphor. The phosphor layer 41 may include a phosphor and a diffusing agent. The thickness of the phosphor layer 41 may be 1 mm or less, for example, in the range of 300 μm to 1 mm or in the range of 300 μm to 700 μm. The content of the phosphor added to the phosphor layer 41 may be 40 wt % or less, for example, in the range of 10 wt % to 23 wt %, or 15 wt % to 30 wt %, based on the weight of the phosphor layer 41. When the thickness of the phosphor layer 41 and the phosphor content exceed the above ranges, the light transmission efficiency may decrease, and when the thickness and the phosphor content are less than the above ranges, the wavelength conversion efficiency may decrease.

Since the ink layer 51 is disposed on the surface of the phosphor layer 41, the phosphor content may be reduced. That is, the light emitted from the light source 21 may be emitted after wavelength conversion by the phosphor layer 41, and the light that is not wavelength converted may be blocked or reflected by the ink layer 51. When a diffusing agent is added to the phosphor layer 41, it may be smaller than the content of the phosphor, and the content of the diffusing agent may be 3 wt % or less based on the weight of the phosphor layer 41, for example, in the range of 1 wt % to 3 wt %. When the content of the diffusing agent exceeds the above range, light transmission efficiency may decrease, and when the content of the diffusion agent is smaller than the above range, light distribution may be non-uniform. In an embodiment of the invention, when the diffusion agent is removed, hot spots may be reduced by using a phosphor and ink particles.

The ink layer 51 may be made of a transparent resin material, for example, a silicone or epoxy material, or UV (ultra violet) resin. The ink layer 51 may have a thickness of 1 mm or less, for example, in a range of 300 μm to 1 mm or in a range of 300 μm to 700 μm. The ink layer 51 may include ink particles. The ink particles may be added in the ink layer 51 in an amount of 20 wt % or less, for example, in a range of 4 wt % to 20 wt %, or in a range of 4 wt % to 15 wt %, based on the weight of the ink layer 51. The lighting device 100 may reduce a color difference in surface colors and reduce hot spots by the content of ink particles. The weight of the ink particles added to the ink layer 51 may be smaller than the weight of the phosphor added to the phosphor layer 41. The ink particles may be distributed on the surface of the wavelength conversion layer 60 rather than the phosphor. Accordingly, the color of the surface of the wavelength conversion layer 60 may be provided as the color of the ink particles. Transmission of light may be suppressed by these ink particles, and hot spots may be lowered. The ink particles may include colored ink particles, for example, may include at least one of metal ink, UV ink, and curing ink. The size of the ink particles may be smaller than the size of the phosphor. The surface color of the ink particles may be any one of green, red, yellow, and blue. The ink types may be selectively applied among PVC (Poly vinyl chloride) ink, PC (Polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (Polystyrene) ink. Here, the width or diameter of the ink particles may be 5 μm or less, or in the range of 0.05 μm to 1 μm. At least one of the ink particles may be smaller than a wavelength of light. The color of the ink particles may include at least one of red, green, yellow, and blue. For example, the phosphor may emit a red wavelength, and the ink particles may include a red color. For example, the red color of the ink particles may be darker than the color of the wavelength of the phosphor or light. The ink particles may have a color different from that of the light emitted from the light source 21. The ink particles may have an effect of blocking or blocking incident light.

The color on the surface of the wavelength conversion layer 60 may be provided as the color sense of the ink particles, and it is possible to reduce the color difference of the external image according to the on/off of the light source 21 and to prevent the deterioration of the wavelength conversion efficiency. The light emitted from the light source 21 is wavelength-converted while passing through the phosphor layer 41 of the wavelength conversion layer 60 and then emitted through the ink layer 51, and the light that is not wavelength-converted may be blocked or reflected by the ink layer 51. Accordingly, the wavelength-converted light may be emitted as surface light through the surface of the wavelength conversion layer 60. Here, the upper portion 42 of the phosphor layer 41 may be formed to be the same as or thicker than the side portion 43 of the phosphor layer 41. Accordingly, the wavelength conversion efficiency in the upper portion 42 of the phosphor layer 41 may be improved. Here, the upper portion 52 of the ink layer 51 may be formed to be the same as or thicker than the side portion 53 of the ink layer 51. Accordingly, hot spots on the upper portion 52 of the ink layer 51 may be suppressed. The side portion 43 of the phosphor layer 41 may be formed in a vertical, inclined or curved shape from the upper portion of the substrate 11 to the upper portion 42 of the phosphor layer 41. The side portion 53 of the ink layer 51 may be formed in a shape having a vertical or inclined or curved surface from the upper portion of the substrate 11 to the upper portion 52 of the ink layer 51. The shapes of the phosphor layer 41 and the ink layer 51 may vary depending on the outer surface of the resin layer 31.

As shown in FIGS. 1 and 3, the substrate 11 may include a recess 13 in a portion of the side surface. The recess 13 may be a groove concave inward from the outer side surface S1 of the substrate 11. The recess 13 may be a hole or a groove penetrating from the upper surface to the lower surface of the substrate 11. When the recess 13 is a groove, a region of the substrate 11 may be disposed under the recess 13. A length (W0, FIG. 1) of the recess 13 is a length in the second direction Y, and may be 500 μm or more, for example, in the range of 500 μm to 10 mm. When the length W0 of the recess 13 is narrower than the above range, the filling pressure may be increased or the filling efficiency may be low when the resin layer 31 is injected. The recess 13 formed in a portion of the outer side surface S1 of the substrate 11 may be spaced apart from one corner of the substrate 11 by a predetermined distance K1, and the distance K1 may be 1 time or more and 3 times or less the length W0 of the recess 13. Accordingly, it is possible to prevent the rigidity of the substrate 11 from being reduced due to the space in which the recess 13 is formed.

As shown in FIG. 3, the width W1 of the recess 13 is a distance from the outer side surface S1 of the substrate 11 in the inner direction (e.g., X) of the resin layer 31, and may be, for example, 0.3 mm or more, for example, in the range of 0.3 mm to 10 mm or in the range of 0.3 mm to 5 mm. The width W1 of the recess 13 may vary depending on the distance D1 from the side surface S2 of the wavelength conversion layer 60 to the outer side surface S1 of the substrate 11. The distance D1 between the outer surface of the recess 13 and the outer surface S2 of the wavelength conversion layer 60 may vary depending on the size to which the upper surface of the substrate 11 is exposed, for example, 0.3 mm or more, in the range of 0.3 mm to 1 mm or in the range of 0.3 mm to 0.8 mm. The distance D1 may be a distance that may not affect the modules according to the cutting process between the modules. The outer surface of the recess 13 may be on the same plane as the side surface of the substrate 11. The distance D2 between the inner side surface of the wavelength conversion layer 60 and the inner surface of the recess 13 may be 0.1 mm or more, for example, in the range of 0.1 mm to 0.4 mm, or in the range of 0.1 mm to 0.3 mm. The distance D2 may vary depending on the thickness of the substrate 11, the depth at which the groove 35A is formed, or the inclination angles R1 and R2. When the width W1 of the recess 13 is narrower than the above range, when the resin layer 31 is injected, the filling pressure may be increased or the filling efficiency may be decreased.

The width W1 of the recess 13 may be greater than the thickness of the phosphor layer 41. The width W1 of the recess 13 may be greater than a thickness of the ink layer 51. The width W1 of the recess 13 may be greater than a thickness of the wavelength conversion layer 60. Accordingly, an end of the side portion of the wavelength conversion layer 60 may be coupled in the recess 13. The width W1 and the length W0 of the recess 13 may be equal to or different from each other. For example, the length W0 of the recess 13 is provided to be greater than the width W1, thereby improving filling efficiency. The depth of the recess 13 may be equal to or smaller than the thickness of the substrate 11. When the depth of the recess 13 is equal to the thickness of the substrate 11, the lower surface of the end portion of the wavelength conversion layer 60 may be exposed to the lower surface of the substrate 11. When the depth of the recess 13 is smaller than the thickness of the substrate 11, the lower surface of the end portion of the wavelength conversion layer 60 is spaced apart from the lower surface of the substrate 11 or may not be exposed to the lower surface of the substrate 11. Alternatively, the lower end of the side portion of the wavelength conversion layer 60 may be disposed in the recess 13 of the substrate 11, or may be located on the same plane as the upper surface of the substrate 11. The total height of the region or the side of the wavelength conversion layer 60 overlapping the recess 13 of the substrate 11 may be greater than or equal to the height of the wavelength conversion layer 60 disposed on the substrate 11.

A portion 35 of the resin layer 31 may be disposed in the recess 13. A portion 45 and 55 of the wavelength conversion layer 60 may be disposed in the recess 13. The portion 35 of the resin layer 31 and the portion 45 and 55 of the wavelength conversion layer 60 may be disposed in the recess 13. An inner region of the recess 13 may overlap the resin layer 31 in a vertical direction. The recess 13 may vertically overlap with the side portions (e.g., 43 and 53) of the wavelength conversion layer 60. The recess 13 may vertically overlap the side portion 43 of the phosphor layer 41 and the side portion 53 of the ink layer 51. At least one or both of the lower end portion 45 of the side portion 43 of the phosphor layer 41 and the lower end portion 55 of the side portion 53 of the ink layer 51 may be disposed in the recess 13.

The portion 35 of the resin layer 31 may be exposed on an outer side surface of the recess 13 in the substrate 11. An outer side surface of the portion 35 of the resin layer 31 may be disposed more outside than the outer side surface S2 of the wavelength conversion layer 60. The outer side surface of the portion 35 of the resin layer 31 may be disposed more outside than the outer side surface of the side 53 of the ink layer 51. The portion 35 of the resin layer 31 is disposed under the upper surface of the substrate 11, and the outer side surface of the resin layer 31 may protrude more outward than the outer side surface of the wavelength conversion layer 60 through the recess 13. The portion 35 of the resin layer 31 may be a protrusion protruding into the recess 13. A lower end of the portion 35 of the resin layer 31 may be exposed on a lower surface of the recess 13 in the substrate 11. At least one or both of the lower end of the side portion 43 of the phosphor layer 41 and the lower end of the side portion 53 of the ink layer 51 may be exposed on the lower surface of the recess 13 in the substrate 11. On the lower surface of the recess 13, an area of the lower surface of the lower end of the side portion 53 of the ink layer 51 may be equal to or greater than the area of the lower surface of the lower end of the side portion 43 of the phosphor layer 41.

The portion 35 of the resin layer 31 may include an inner portion 13A disposed inside the lower end portion (e.g., 45, 55) of the side portion of the wavelength conversion layer 60 and an outer portion exposed to the outside. The lower end portion of the side portion of the wavelength conversion layer 60 may extend between the inner portion 13A and the outer portion. A lower end portion 45 of the side portion 43 of the phosphor layer 41 may be disposed between the inner portion 13A and the outer portion, or the lower end portion 45 of the side portion 43 of the phosphor layer 41 and the lower end portion 55 of the side portion 53 of the ink layer 51 may be disposed between the inner portion 13A and the outer portion. The inner side surfaces of the lower end portions 45 and 55 of the wavelength conversion layer 60 disposed in the recess 13 may be inclined at a first angle R1. The first angle R1 may be formed at an acute angle with respect to the horizontal lower surface of the substrate 11. The outer side surface of the lower end portion of the wavelength conversion layer 60 disposed in the recess 13 may be inclined at a second angle R2. The second angle R2 may be formed at an acute angle with respect to the horizontal lower surface of the substrate 11. The first angle R1 and the second angle R2 may be the same or different from each other, and may range from 1 degree to 60 degrees or from 5 degrees to 30 degrees. The first angle R1 and the second angle R2 may vary depending on the angle of the groove 35A in which a portion 35 of the resin layer 31 is cut in the recess 13. The cutting may be performed from the lower surface of the portion 35 of the resin layer 31 toward the upper portion of the recess 13, and the cut groove 35A may be formed in a triangular or a rectangular shape within the recess 13. A total area of the cut groove 35A may be smaller than an area of the recess 13. The lower surface area of the groove 35A may be larger than the upper surface area. An inner surface of the lower end portion of the wavelength conversion layer 60 may be in contact with the substrate 11, or may be in contact with a surface or a side surface of the recess 13. That is, the lower end portion 45 of the side portion 43 of the phosphor layer 41 may contact the inner surface and both side surfaces of the recess 13. The lower end portion 55 of the side portion 53 of the ink layer 51 may contact both side surfaces of the recess 13. Accordingly, since the lower end of the wavelength conversion layer 60 is in contact with the inner surface of the substrate 11, which is the side surface of the recess 13, the space between the wavelength conversion layer 60 and the substrate 11 is reduced or eliminated and light leakage may be blocked.

Here, the lower end portion 45 of the phosphor layer 41 may be formed to have a thickness equal to or thinner than the thickness of the side portion 43 of the phosphor layer 41. Since the lower end portion 45 of the phosphor layer 41 is formed along the inclined inner surface of the cut groove 35A, the phosphor layer 41 may have a thickness equal to or less than the thickness of the side portion 43 of the phosphor layer 41. Here, the lower end portion 55 of the ink layer 51 may be formed to have a thickness equal to or thicker than the thickness of the side portion 53 of the ink layer 51. Since the lower end portion 55 of the ink layer 51 is filled between the inclined outer surface of the cut groove 35A and the outer surface of the lower end portion 45 of the phosphor layer 41, the lower end portion 55 of the ink layer 51 may be formed to be thicker than the thickness of the side portion 53 of the ink layer 51. The outer upper surface of the portion 35 of the resin layer 31 disposed in the recess 13 may be provided as a stepped structure with respect to the outer side surface S2 of the wavelength conversion layer 60 or the outer side surface of the ink layer 51.

Figure 4:
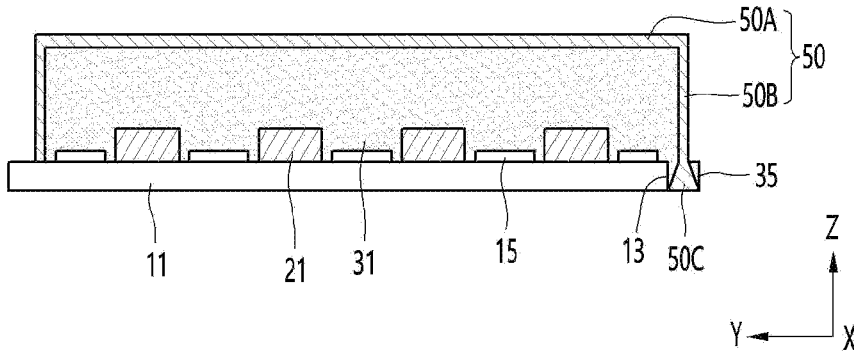
FIG. 4 is a first modified example of the lighting device of FIG. 2.

Referring to the first modified example of FIG. 4, a portion of the resin layer 31 may extend or protrude from the recess 13 of the substrate 11. A lower end portion 50C of the wavelength conversion layer 50 may extend through a portion of the resin layer 31 disposed in the recess 13. The wavelength conversion layer 50 may include an upper portion 50A and a side portion 50B. A lower end portion 50C of the wavelength conversion layer 50, for example, a lower end portion 50C of the side portion 50B, extends in the recess 13 of the substrate 11 or may penetrate a portion 35 of the resin layer 31. The wavelength conversion layer 50 may be formed as a single layer, and may include a phosphor and ink particles therein. The content of the phosphor added to the wavelength conversion layer 50 may be greater than the content of the ink particles. The content of the phosphor may be added in a range of 23 wt % or less or 10 wt % to 23 wt % based on the weight of the wavelength conversion layer 50, and the ink particles may be added in an amount of 12 wt % or less, for example, in the range of 4 wt % to 12 wt % based on the weight of the wavelength conversion layer 50. The phosphor content in the wavelength conversion layer 50 may be higher than the content of the ink particles by 3 wt % or more, or may be added in a range of 3 wt % to 13 wt %, based on the weight of the wavelength conversion layer 50. Since the weight of the ink particles is smaller than the weight of the phosphor, the ink particles may be distributed in a region adjacent to the surface of the wavelength conversion layer 50 than the phosphor. Accordingly, the color of the surface of the wavelength conversion layer 50 may be provided as the color of the ink particles. Transmission of light may be suppressed by these ink particles, and hot spots may be lowered.

The lower end portion 50C of the wavelength conversion layer 50 may be provided with a wider width or thickness toward the lower surface of the recess 13. The lower end portion 50C of the wavelength conversion layer 50 is further spaced apart from the outer side surface of the substrate 11 from the upper end of the inner surface toward the lower end of the inner surface, and may be closer to the outer side surface of the substrate 11 from the upper end toward the lower end of the outer surface. The recess 13 may be provided as a groove or a hole, and in the case of the groove, it may be formed on the upper surface of the substrate 11 to a depth smaller than the thickness of the substrate 11. The lower end portion of the wavelength conversion layer 50 disposed in the groove may be spaced apart from the lower surface of the substrate 11. In this structure, when the thickness of the substrate 11 is 1 mm or more, a groove may be provided in the substrate 11. Since the outer surface of the lower end portion 50C of the wavelength conversion layer is covered by the portion 35 of the resin layer 31, it may not be exposed to the outer surface of the substrate 11.

Figure 5:
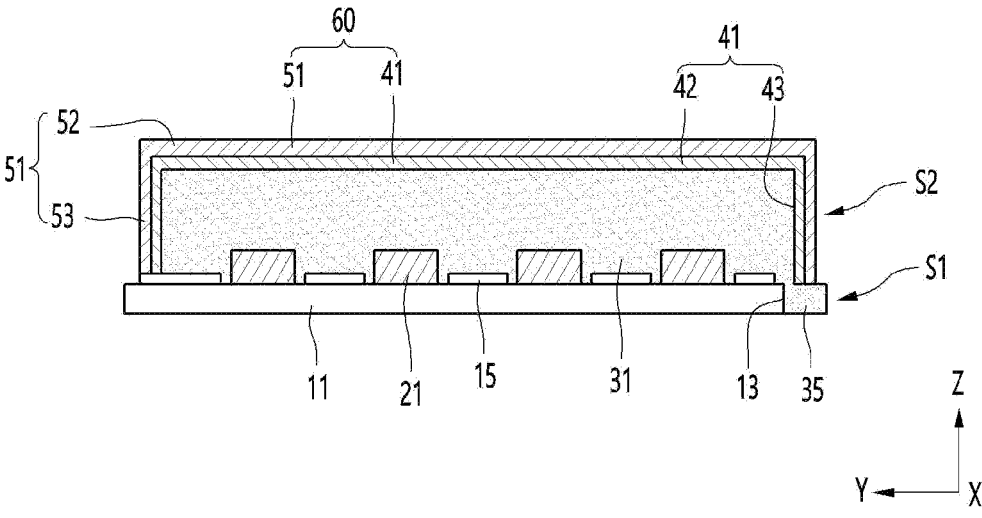
FIG. 5 is a second modified example of the lighting device of FIG. 2.

Referring to the second modified example of FIG. 5, the recess 13 of the substrate 11 may be disposed on a portion of one side surface S1. A portion 35 of the resin layer 31 may extend or protrude from the recess 13 of the substrate 11. Here, lower ends of side portions (e.g., 43 and 53) of the wavelength conversion layer 60 may be disposed on the recess 13. The lower ends of the side portions (e.g., 43 and 53) of the wavelength conversion layer 60 may contact a portion 35 of the resin layer 31 disposed in the recess 13. That is, at least one or both of the lower end of the side portion 43 of the phosphor layer 41 and the lower end of the side portion 53 of the ink layer 51 of the wavelength conversion layer 60 may be in contact with a portion 35 of the resin layer 31 exposed to the surface of the recess 13. The portion 35 of the resin layer 31 disposed in the recess 13 may vertically overlap side portions (e.g., 43 and 53) of the wavelength conversion layer 60. A portion 35 of the resin layer 31 disposed in the recess 13 may overlap the side portion 43 of the phosphor layer 41 and the side portion 53 of the ink layer 51 in a vertical direction.

An outer side surface of the portion 35 of the resin layer 31 may be disposed on the same plane as the outer side surface S1 of the substrate 11. An outer side surface of a portion 35 of the resin layer 31 may be disposed more outside than the outer side surface S2 of the wavelength conversion layer 60 or an outer side surface of the ink layer 51. Here, since the lower end of the side portion of the wavelength conversion layer 60 is in contact with the surface of the portion 35 of the resin layer 31, the interval between the lower end of the side portion of the wavelength conversion layer 60 and the substrate 11 may be narrowed. Accordingly, it is possible to reduce light leakage through the interval between the substrate 11 and the wavelength conversion layer 60.

Figure 6:
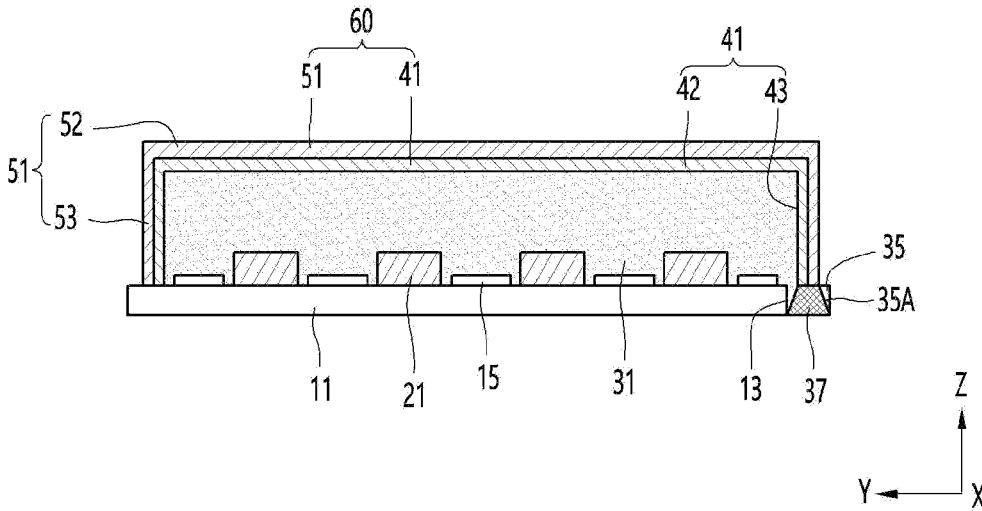
FIG. 6 is a third modified example of the lighting device of FIG. 2.

Referring to the third modified example of FIG. 6, a cut groove 35A may be formed in the recess 13 of the substrate 11 and a light blocking portion 37 may be formed by the cut groove 35A. The light blocking portion 37 may be formed in the groove 35A and may be in contact with an inner surface of the substrate 11 or surfaces of the recess 13. The light blocking portion 37 may block light leakage in the recess 13. The light blocking portion 37 may include an organic filler or an inorganic filler in the resin. The light blocking portion 37 may include a filler that reflects or absorbs light.

Figure 7:
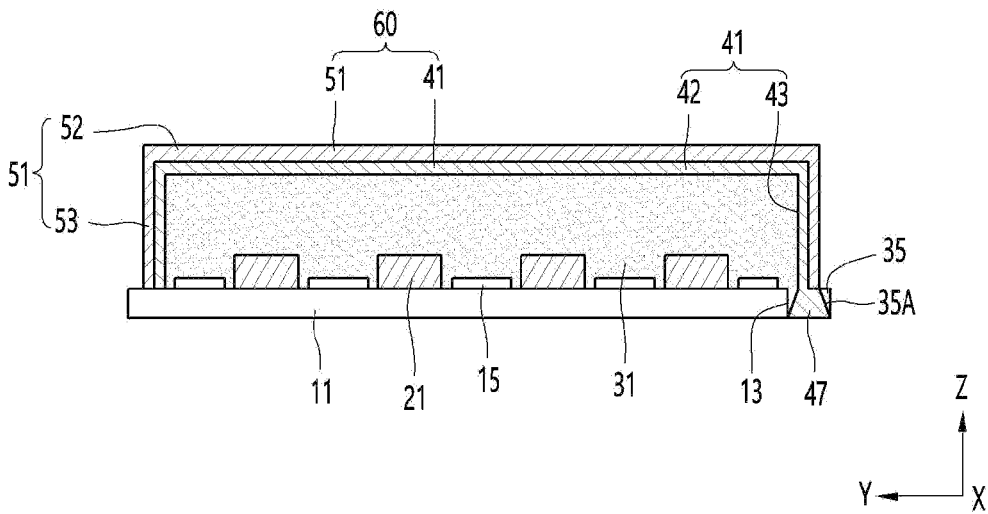
FIG. 7 is a fourth modified example of the lighting device of FIG. 2.
Figure 8:
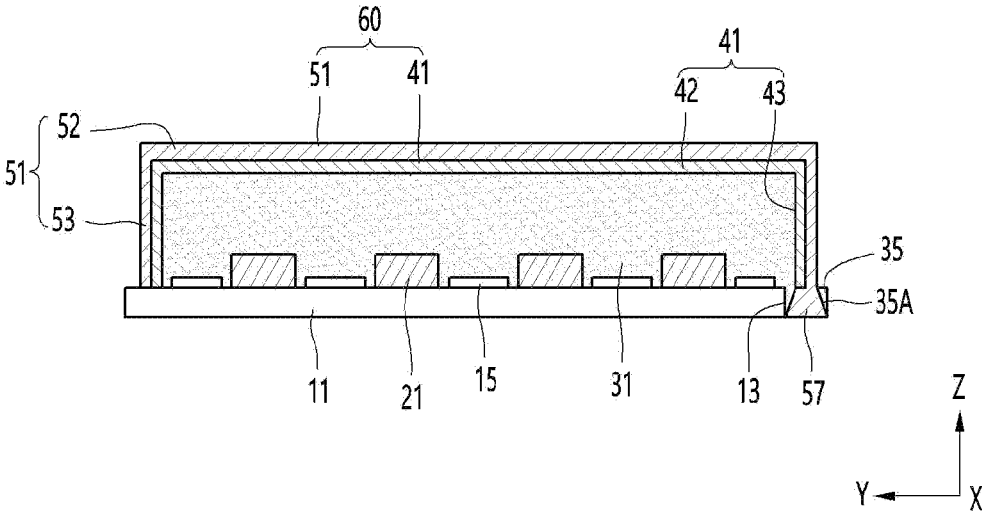
FIG. 8 is a fifth modified example of the lighting device of FIG. 2.

Referring to the fourth and fifth modifications of FIGS. 7 and 8, a portion 35 of the resin layer 31 may extend or protrude from the recess 13 of the substrate 11. A lower end portion of the phosphor layer 41 or the ink layer 51 of the wavelength conversion layer 60 may be disposed in the recess 13. As shown in FIG. 7, the lower end portion 47 of the phosphor layer 41 may be disposed in the recess 13. Accordingly, since the lower end portion 47 of the phosphor layer 41 is filled in the region of the recess 13, it is possible to prevent the light of light source 21 from direct leaking. Here, the lower end of the side portion 53 of the ink layer 51 may be in contact with the lower end portion 47 extending from the side portion 43 of the phosphor layer 41. A lower end of the side portion 53 of the ink layer 51 may vertically overlap with the lower end 57 of the side portion 43 of the phosphor layer 41. As shown in FIG. 8, a lower end portion 57 of the ink layer 51 may be disposed in the recess 13. Accordingly, since the lower end portion 57 of the ink layer 51 is filled in the region of the recess 13, it is possible to prevent light leakage due to the ink particles. Here, the lower end of the side portion 43 of the phosphor layer 41 may be in contact with the lower end portion 57 extending from the side portion 53 of the ink layer 51. The lower end of the side portion 43 of the phosphor layer 41 may vertically overlap with the lower end 57 of the side portion 53 of the ink layer 51. As shown in FIGS. 7 and 8, since a portion 35 of the resin layer 31 and the lower end portion 47 of the phosphor layer 41 or the lower end portion 57 of the ink layer 51 is formed in the recess 13 of the substrate 11, it is possible to suppress moisture penetration and suppress light leakage.

Figure 9:
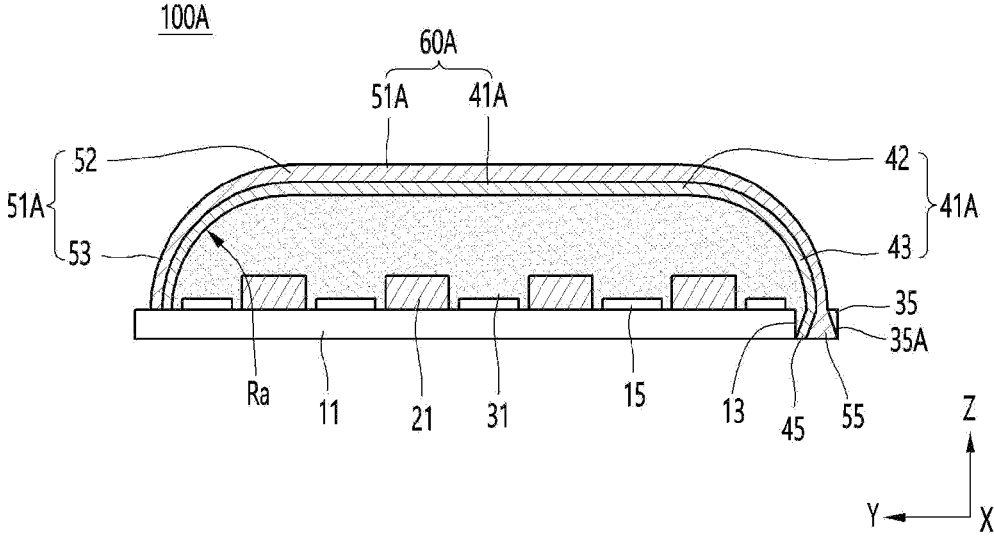
FIG. 9 is a sixth modified example of the lighting device of FIG. 2.

Referring to the sixth modified example of FIG. 9, the resin layer 31 disposed on the substrate 11 and the light source 21 in the lighting device 100A may include a convex curved surface Ra extending from the upper surface to the lower end of the side surface. The wavelength conversion layer 60A may be stacked on the upper surface and the curved surface Ra of the resin layer 31. For example, the upper portion 42 and the side portion 43 of the phosphor layer 41A may extend on the upper surface and the curved surface Ra of the resin layer 31, and may extend the upper portion 52 and the side portion 53 of the ink layer 51A. Accordingly, the side portion 43 of the phosphor layer 41A and the side portion 53 of the ink layer 51A may be provided with a convex curved surface. The side portion 43 of the phosphor layer 41A and the side portion 53 of the ink layer 51A may be formed to have the same curvature as that of the curved surface Ra of the resin layer 31A. The portion 35 of the resin layer 31A may extend or protrude from the recess 13 of the substrate 11. The lower end portion 45 of the side portion 43 of the phosphor layer 41A and/or the lower end portion 55 of the side portion 53 of the ink layer 51 may be extended or protruded in the recess 13 of the substrate 11.

Figure 10:
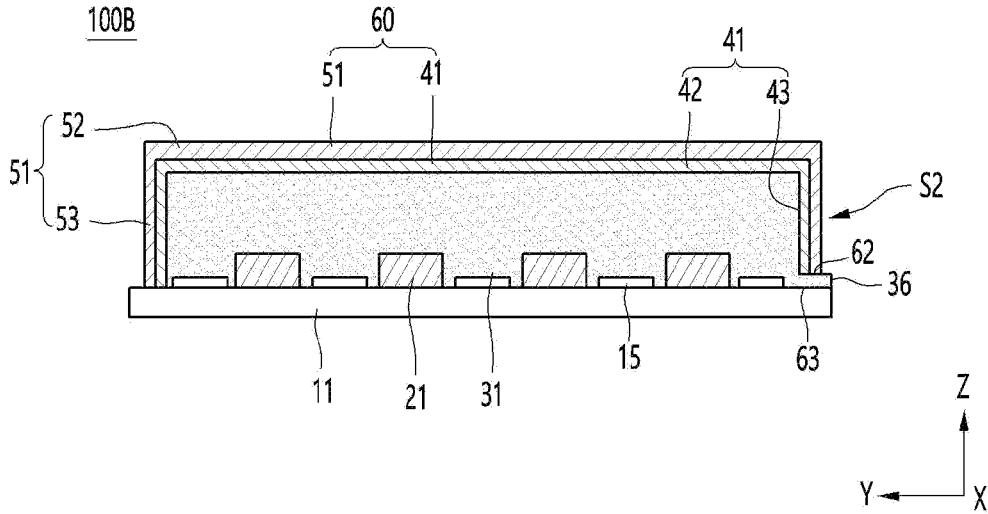
FIG. 10 is a side cross-sectional view illustrating another example of a lighting device according to an embodiment of the invention.

Referring to the seventh modification of FIG. 10, the substrate 11 may be provided without the recess 13. A resin layer 31 covering the substrate 11 and the light source 21 is disposed, and a portion 36 of a side surface of the resin layer 31 is exposed or protruded through the open hole 63 of the wavelength conversion layer 60. The wavelength conversion layer 60 may include a first region 62 having a side surface corresponding to one side surface of the resin layer 31. The first region 62 of the wavelength conversion layer 60 and a portion 36 of a side surface of the resin layer 31 may overlap in a vertical direction. A portion 36 of the side surface of the resin layer 31 may be in contact with the substrate 11 and/or the reflective member 15. The first region 62 is an end region of the side surface of the wavelength conversion layer 60, and may be, for example, an end portion of the side surface of the phosphor layer 41 and/or an end portion of the side surface of the ink layer 51. The wavelength conversion layer 60 may have a hole 63 on the first region 62 and the substrate 11, and the portion 36 of the side surface of the resin layer 31 through the hole 63 may be exposed or protruded. The first region 62 of the wavelength conversion layer 60 may be disposed on the hole 63 of the wavelength conversion layer 60. The height of the hole 63 may be 0.5 mm or less, for example, in the range of 0.2 mm to 0.5 mm. A material such as a phosphor layer 41 and/or an ink layer 51 may be formed on a side portion 36 of the resin layer 31.

A manufacturing process of the lighting device will be described with reference to FIGS. 11 and 12.

As shown in FIG. 11(A)(B), a light source 21 having a plurality of light emitting devices is disposed on a substrate 11. Each of the plurality of light emitting devices may be spaced apart by a predetermined pitch, thereby reducing light interference between each other and improving heat dissipation efficiency. The pitch may be, for example, 2.5 mm or more, such as in the range of 2.5 mm to 8 mm, or 5 mm or more, such as in the range of 5 mm to 7 mm. The interval between the light emitting devices may vary depending on the size of the LED chip. Recesses 13 penetrating from the upper surface to the lower surface of the substrate 11 may be respectively disposed in a portion of the substrate 11. The recesses 13 may be respectively disposed in regions between adjacent unit modules. The lower frame 91 is supported by the lower portion of the recess 13. The lower frame 91 is disposed under the substrate 11, and the upper frame 81 is coupled to the upper portion of the substrate 11. A resin injection hole 85 may be provided in the upper frame 81, and the resin injection hole 85 may be connected to the recesses 13. An empty space 83 for a resin layer covering the light source 21 may be disposed in the upper frame 91, respectively.

Figure 11:
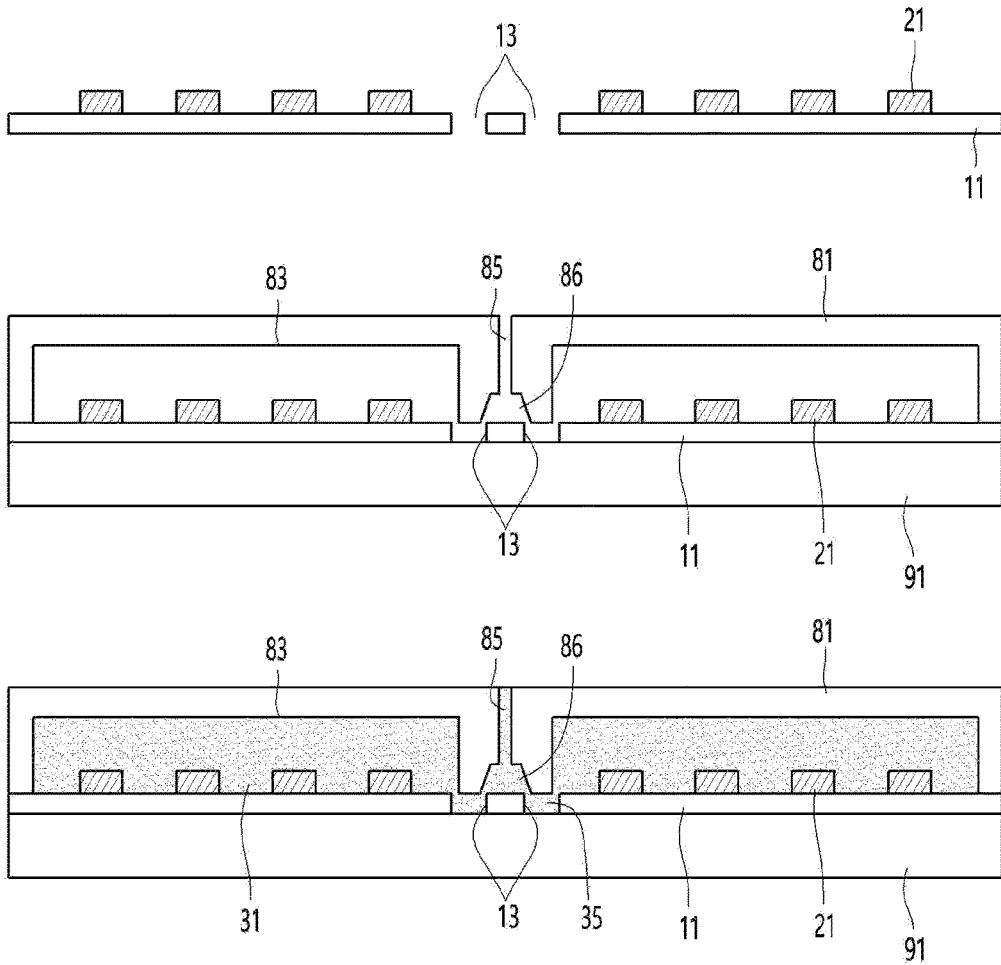
FIGS. 11 and 12 are views illustrating a manufacturing process of the lighting device of FIG. 2.
Figure 12:
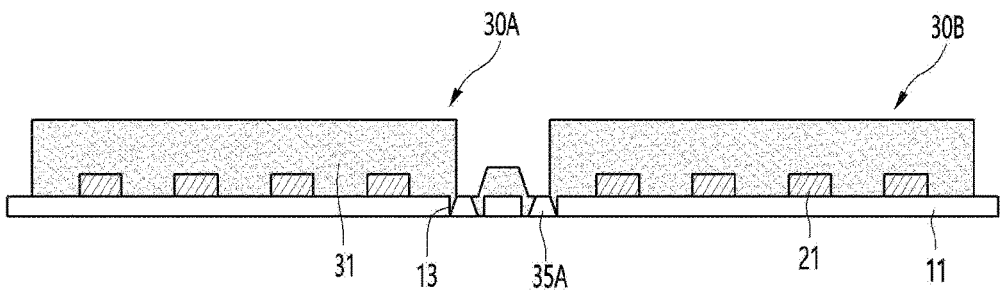
Figure 12:
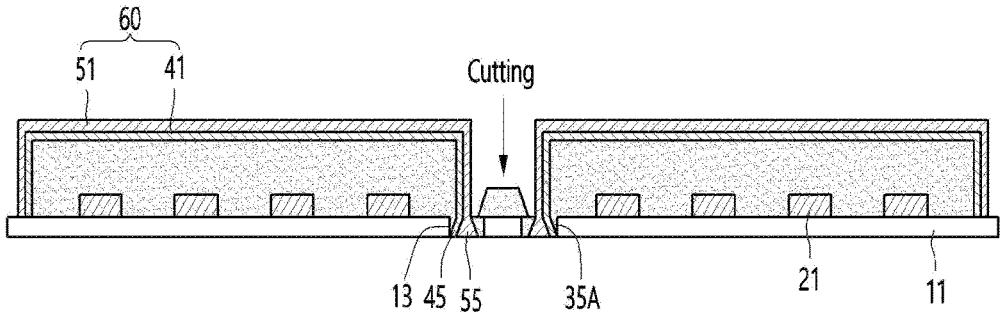
Figure 12:
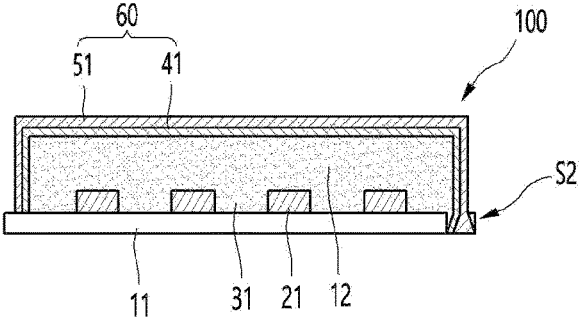

As shown in FIG. 11©, a liquid resin is injected through the resin injection hole 85. At this time, the resin injection pressure may fill the entire region of the resin through the empty space 83 of the upper frame 81. In this case, the resin may be filled in the recess 13.

As shown in FIGS. 11(C) and 12(D), when the resin is cured, the upper frame 81 and the lower frame 91 are separated, and the resin layer 31 may be connected through a recess 13 between adjacent modules. A portion of the resin layer 31 filled in the recess 13 is cut to provide a groove 35A. The groove 35 in which the portion of the resin layer 31 is cut may be concave from the lower surface of the recess 13 toward the upper surface, and may be opened in the upper direction. Here, the groove 35 of the recess 13 is formed in the shape of a hole formed to the depth of the recess 13 on the lower surface of the recess 13, or is may be formed in a groove shape having a depth smaller than that of the recess 13.

As shown in FIG. 12(E), the wavelength conversion layer 60 is formed on the surface of the resin layer 31. The wavelength conversion layer 60 may include at least one or both of the phosphor layer 41 and the ink layer 51. At this time, the wavelength conversion layer 60 may be formed through injection molding or a dispensing process. The phosphor layer 41 of the wavelength conversion layer 60 may be formed on the surface of the resin layer 31, and the ink layer 51 may be formed on the surface of the phosphor layer 41. A portion of the wavelength conversion layer 60 may extend into the groove 35A (FIG. 12(F)) of the recess 13. For example, a portion of the phosphor layer 41 extends into the groove 35A of the recess 13 and may be in contact with the portion 35 of the resin layer 31 disposed in the groove 35A of the recess 13. A portion of the ink layer 51 extends into the groove 35A of the recess 13 and may be in contact with a portion of the phosphor layer 41 disposed in the groove 35A of the recess 13. When the phosphor layer 41 and the ink layer 51 are stacked, a lower surface of a portion of the phosphor layer 41 and the ink layer 51 may be exposed through the lower surface of the recess 13. As shown in FIG. 12(E)(F), the unit module size is cut. During the cutting, each of the individual modules may be manufactured by cutting the substrate 11 between the recesses 13 through the space between the adjacent wavelength conversion layers 60.

Figure 13:
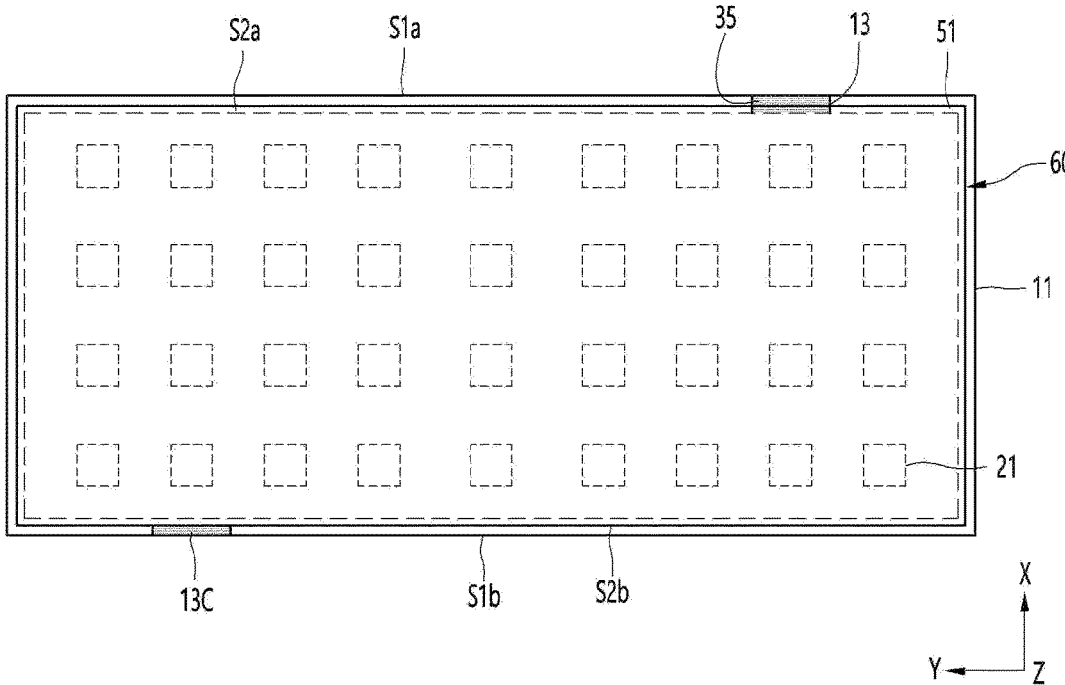
FIGS. 13 and 14 are modified examples of a recess of a substrate in the lighting device of FIG. 1.

As shown in FIG. 13, the recesses 13 and 13C of the substrate 11 may be respectively formed on side surfaces S1a and S1b of the substrate 11 opposite to each other. The recesses 13 and 13C of the substrate 11 may be spaced apart from each other by a greater distance than the width of the wavelength conversion layer 60 in the second direction. The first recess 13 is concave in the direction from the first side surface S1a toward the second side surface S2b of the substrate 11 and may overlap the first side surface S2a of the wavelength conversion layer 60 in the vertical direction. The second recess 13C is concave from the second side surface S1*b* toward the first side surface S1*a* of the substrate 11 and may overlap the second side surface S2*b* of the wavelength conversion layer 60 in the vertical direction. Accordingly, since the recesses 13 and 13C of the substrate 11 are spaced apart from each other, the filling efficiency of the resin may be improved. Each of the recesses 13 and 13C may be selected from the structures of FIGS. 1 to 10.

Figure 14:
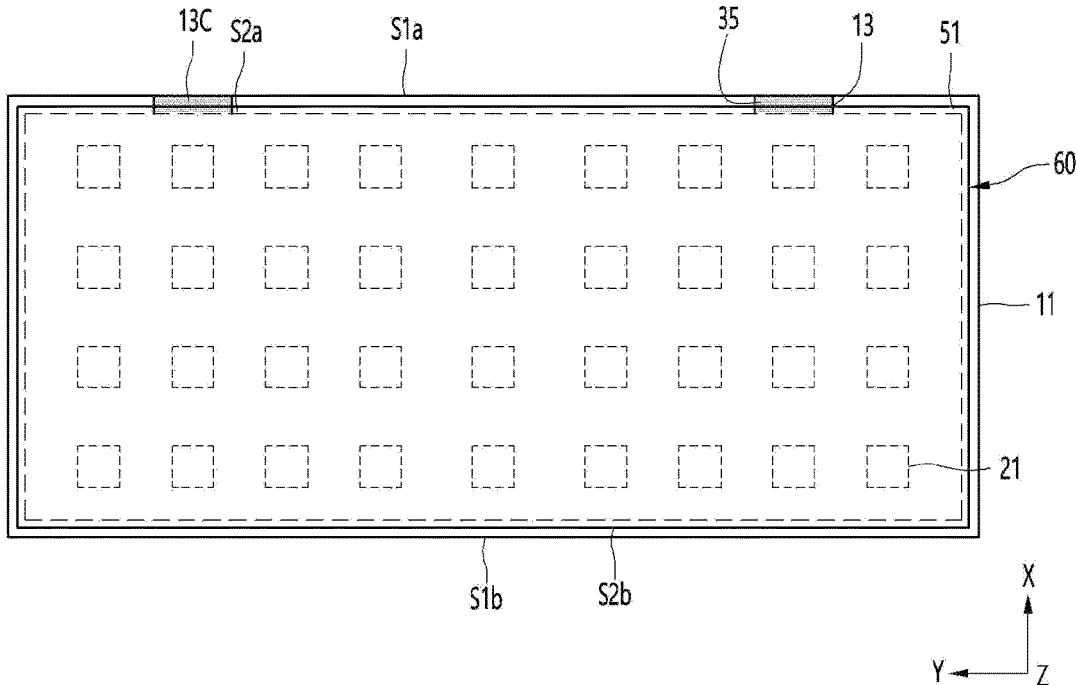

As shown in FIG. 14, the recesses 13 and 13C of the substrate 11 may be respectively formed on the same first side surface S1*a* of the substrate 11. The recesses 13 and 13C of the substrate 11 may be spaced apart from each other by ½ or more of the length of the wavelength conversion layer 60 in the first direction X. The first and second recesses 13 and 13C are concave in a direction from the first side surface S1*a* toward the second side surface S1*b* of the substrate 11, and may overlap the first side surface S2*a* of the wavelength conversion layer 60 in the vertical direction. The first recess 13 and the second recess 13C may be disposed at the same distance from the center of the second direction Y of the first side S1*a* of the substrate 11. Accordingly, since the recesses 13 and 13C of the substrate 11 are disposed in different regions, the filling efficiency of the resin may be improved. Each of the recesses 13 and 13C may be selected from the structures of FIGS. 1 to 10.

Figure 15:
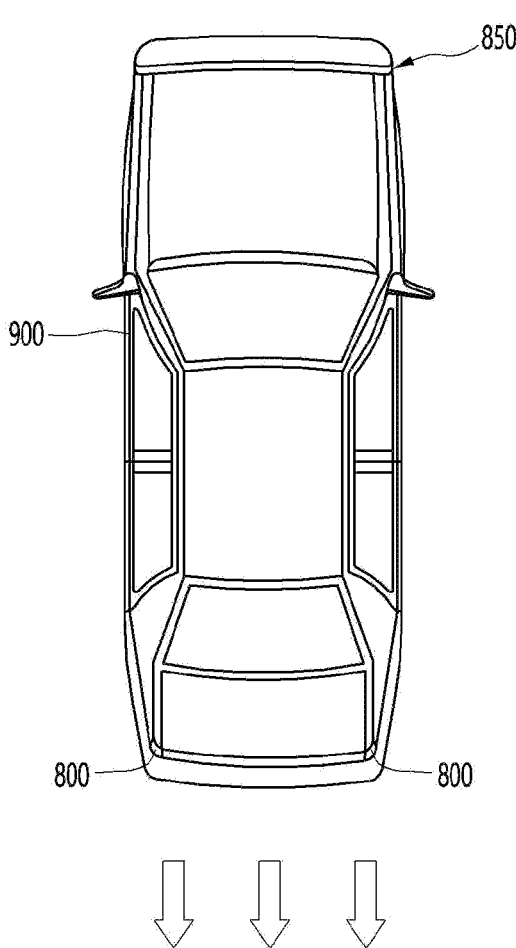
FIG. 15 is a plan view of a vehicle to which a lamp having a lighting device according to an embodiment of the invention is applied.
Figure 16:
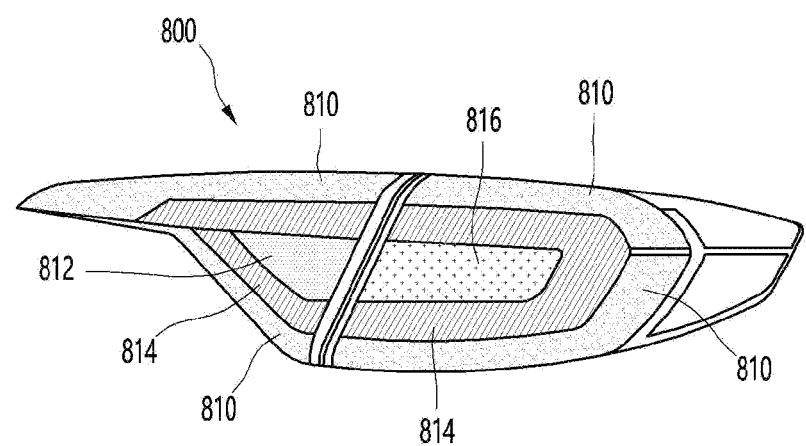
FIG. 16 is a view showing a detailed configuration of a tail light of the vehicle lamp of FIG. 15.

FIG. 15 is a plan view of a vehicle to which a vehicle lamp to which a lighting device is applied according to an embodiment is applied, and FIG. 16 is a view illustrating a lighting device or a vehicle lamp having the lighting device disclosed in the embodiment.

Referring to FIGS. 15 and 16, the front lamp 850 in the moving object or vehicle 900 may include one or more lighting modules, and control the driving timing of these lighting modules individually to function as a typical headlamp as well as, when the driver opens the vehicle door, additional functions such as a welcome light or a celebration effect can be provided. The lamp may be applied to a daytime running lamp, a high beam, a low beam, a fog lamp or a turn signal lamp. In the vehicle 900, the tail lamp 800 may be arranged with a plurality of lamp units 810, 812, 814, and 816 supported by the housing 801. For example, the lamp units 810, 812, 814, and 816 may include a first lamp unit 810 disposed outside, a second lamp unit 814 disposed around the inner circumference of the first lamp unit 810, and third and fourth lamp units 814 and 816 respectively disposed on the inside the second lamp unit 814. The first to fourth lamp units 810, 812, 814, and 816 may selectively apply the lighting device disclosed in the embodiment, and a red lens cover or a white lens cover for the lighting characteristics of the lamp units 810, 812, 814, and 816 on the outside of the lighting device may be placed. The lighting device disclosed in the embodiment applied to the lamp units 810, 812, 814, and 816 may emit surface light in a uniform distribution. The first and second lamp units 810 and 812 may be provided in at least one of a curved shape, a straight shape, an angled shape, an inclined shape, and a flat shape, or a mixed structure thereof. One or a plurality of the first and second lamp units 810 and 812 may be disposed in each tail lamp. The first lamp unit 810 may be provided as a tail lamp, the second lamp unit 812 may be provided as a brake lamp, and the third lamp unit 814 may be provided as a reverse lamp, and the fourth lamp unit 816 may be provided as a turn signal lamp. The structure and position of these lighting lamps can be changed.

Features, structures, effects, etc. described in the above embodiments are included in at least one embodiment of the invention, and are not necessarily limited to only one embodiment. Furthermore, features, structures, effects, etc.

illustrated in each embodiment can be combined or modified for other embodiments by those of ordinary skill in the art to which the embodiments belong. Accordingly, the contents related to such combinations and modifications should be interpreted as being included in the scope of the invention. In addition, although the embodiment has been described above, it is merely an example and does not limit the invention, and those of ordinary skill in the art to which the invention pertains are exemplified above in a range that does not depart from the essential characteristics of the present embodiment. It can be seen that various modifications and applications that have not been made are possible. For example, each component specifically shown in the embodiment can be implemented by modification. And differences related to such modifications and applications should be construed as being included in the scope of the invention defined in the appended claims.

The invention claimed is:

1. A lighting device comprising:
   a substrate including a recess;
   a light source disposed on the substrate;
   a resin layer disposed on the substrate; and
   a wavelength conversion layer disposed on the resin layer;
   wherein a portion of the resin layer is disposed in the recess of the substrate,
   wherein a portion of the wavelength conversion layer is disposed on the recess of the substrate;
   wherein a depth of the recess of the substrate is equal to a thickness of the substrate; and
   wherein an outermost surface of the portion of the resin layer disposed in the recess of the substrate is located outside an inner surface of the wavelength conversion layer.

2. The lighting device of claim 1, wherein the recess of the substrate overlaps side surfaces of the wavelength conversion layer and the resin layer in a vertical direction.

3. The lighting device of claim 1, wherein a portion of the recess of the substrate is located outside an outer surface of the resin layer.

4. The lighting device of claim 3, wherein another portion of the recess of the substrate is located inside the outer surface of the resin layer.

5. The lighting device of claim 1, wherein a width of the recess of the substrate is greater than a thickness of the wavelength conversion layer.

6. The lighting device of claim 1,
   wherein a lower end portion of the wavelength conversion layer overlapping the recess of the substrate is disposed in the recess of the substrate.

7. The lighting device of claim 1,
   wherein a maximum height of a region of the wavelength conversion layer overlapping the recess of the substrate is greater than a height of the wavelength conversion layer disposed on the substrate.

8. The lighting device of claim 1,
   wherein a width of the recess is greater than a thickness of the wavelength conversion layer, and
   wherein a lower end portion of the wavelength conversion layer disposed in the recess is exposed to a lower surface of the substrate.

9. The lighting device of claim 1, wherein the wavelength conversion layer comprises a phosphor layer and an ink layer disposed on the phosphor layer,
   wherein at least one of a lower end portion of the phosphor layer and a lower end portion of the ink layer is disposed in the recess.

US 12,598,841 B2

19

20

10. A lighting device comprising:
a substrate including a recess;
a light source disposed on the substrate;
a resin layer disposed on the substrate; and
a wavelength conversion layer disposed on the resin layer;
wherein the light source includes a plurality of light emitting devices arranged in N rows and M columns, wherein N, M is an integer of 1 or more, M is 2 or more,
wherein the wavelength conversion layer includes an upper portion disposed on an upper surface of the resin layer, and a side portion connected to the upper portion and disposed on a side surface of the resin layer,
wherein the recess of the substrate vertically overlaps with a portion of the side portion of the wavelength conversion layer, and
wherein a depth of the recess in the substrate is equal to a thickness of the substrate.

11. The lighting device of claim 10, wherein a width of the recess of the substrate is greater than a thickness of the wavelength conversion layer.

12. The lighting device of claim 10, wherein a lower end portion of the wavelength conversion layer overlapping the recess of the substrate is disposed in the recess of the substrate or on a same plane as an upper surface of the substrate.

13. The lighting device of claim 10, wherein a maximum height of a region of the wavelength conversion layer overlapping the recess of the substrate is greater than or equal to a height of the wavelength conversion layer disposed on the substrate.

14. The lighting device of claim 10, wherein the recess is a hole disposed in a portion of the substrate and penetrating from an upper surface to a lower surface of the substrate, and
wherein a width of the recess is greater than a thickness of the wavelength conversion layer.

15. The lighting device of claim 10, wherein the light emitting device includes an LED chip and a resin member disposed on the LED chip.

16. The lighting device of claim 10, wherein the wavelength conversion layer includes a phosphor layer and an ink layer disposed on the phosphor layer.

17. The lighting device of claim 10, wherein the wavelength conversion layer is formed by mixing a colored phosphor and a colored ink.

18. The lighting device of claim 10, wherein a pitch between two adjacent light emitting devices among the plurality of light emitting devices is 5 mm or more.

19. A lighting device comprising:
a substrate including a recess;
a light source disposed on the substrate;
a resin layer disposed on the substrate; and
a wavelength conversion layer disposed on the resin layer;
wherein a portion of the resin layer is disposed in the recess of the substrate,
wherein a portion of the wavelength conversion layer is disposed in or on the recess of the substrate,
and wherein the recess is configured to be recessed towards a center of the substrate from a side surface of the substrate.

20. A lighting device comprising:
a substrate including a recess;
a light source disposed on the substrate;
a resin layer disposed on the substrate; and
a wavelength conversion layer disposed on the resin layer;
wherein a portion of the resin layer is disposed in the recess of the substrate,
wherein a portion of the wavelength conversion layer is disposed in or on the recess of the substrate,
and wherein the light source does not overlap the recess in a vertical direction which is a direction from an upper surface to a lower surface of the substrate.

* * * * *